United States Patent
Poulad

(10) Patent No.: US 10,126,127 B2
(45) Date of Patent: Nov. 13, 2018

(54) ATHERMALIZED MOUNTING OF INERTIAL MEASUREMENT UNIT

(71) Applicant: Microsoft Technology Licensing, LLC, Redmond, WA (US)

(72) Inventor: Navid Poulad, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 266 days.

(21) Appl. No.: 15/142,064

(22) Filed: Apr. 29, 2016

(65) Prior Publication Data

US 2017/0314922 A1 Nov. 2, 2017

(51) Int. Cl.
| | | |
|---|---|---|
| *G01C 19/00* | (2013.01) | |
| *G01P 15/02* | (2013.01) | |
| *H05K 1/18* | (2006.01) | |
| *H05K 7/14* | (2006.01) | |
| *G01P 1/02* | (2006.01) | |
| *G01P 3/00* | (2006.01) | |
| *H05K 5/00* | (2006.01) | |

(Continued)

(52) U.S. Cl.
CPC .............. *G01C 19/00* (2013.01); *G01P 1/023* (2013.01); *G01P 3/00* (2013.01); *G01P 15/02* (2013.01); *H05K 1/181* (2013.01); *H05K 5/0078* (2013.01); *H05K 7/142* (2013.01); *H05K 7/1422* (2013.01); *H05K 1/0271* (2013.01); *H05K 7/12* (2013.01); *H05K 2201/068* (2013.01); *H05K 2201/10151* (2013.01); *H05K 2201/10295* (2013.01); *H05K 2201/10393* (2013.01); *H05K 2201/2036* (2013.01); *H05K 2201/2045* (2013.01)

(58) Field of Classification Search
CPC . G01C 19/00; G01P 1/023; G01P 3/00; G01P 15/02; H05K 5/0078; H05K 7/142; H05K 7/1422
USPC ....................................... 73/514.01
See application file for complete search history.

(56) References Cited

U.S. PATENT DOCUMENTS

| 3,184,536 A | 5/1965 | Vincent |
|---|---|---|
| 4,255,003 A | 3/1981 | Berg |

(Continued)

FOREIGN PATENT DOCUMENTS

| EP | 2757864 | 7/2014 |
|---|---|---|
| JP | 2011155190 A | 8/2011 |
| WO | WO2013023926 | 2/2013 |

OTHER PUBLICATIONS

"International Search Report and the Written Opinion issued in PCT Application No. PCT/US2017/029987," dated Oct. 20, 2017.

(Continued)

*Primary Examiner* — Son Le
*Assistant Examiner* — Tarun Sinha
(74) *Attorney, Agent, or Firm* — Workman Nydegger

(57) ABSTRACT

Printed circuit boards (PCBs) are configured with an athermalized mounting suitable for securing and positioning and the PCBs within an inertial measurement unit (IMU). The PCBs include integrated circuit (IC) components, such as accelerometers and/or gyroscopes, which require relative positional stability within the IMU environment in order to provide accurate results. The athermalized mounting configuration of the PCB enables the PCBs to experience thermal expansion within the IMU without causing significant displacement of the IC relative to the IMU environment.

20 Claims, 7 Drawing Sheets

(51) Int. Cl.
 *H05K 1/02* (2006.01)
 *H05K 7/12* (2006.01)

(56) References Cited

U.S. PATENT DOCUMENTS

| | | | |
|---|---|---|---|
| 5,383,168 A | 1/1995 | O'Brien et al. | |
| 5,557,474 A | 9/1996 | McCrary | |
| 5,895,999 A * | 4/1999 | Okaguchi | G01C 19/5663 |
| | | | 310/348 |
| 6,040,950 A | 3/2000 | Broome | |
| 6,252,768 B1 | 6/2001 | Lin | |
| 6,581,481 B1 * | 6/2003 | Perusek | G01L 5/165 |
| | | | 606/54 |
| 6,771,437 B1 | 8/2004 | Willis | |
| 6,943,292 B2 * | 9/2005 | Dingman | H05K 7/142 |
| | | | 174/535 |
| 7,899,311 B1 | 3/2011 | Kearney et al. | |
| 7,990,632 B2 | 8/2011 | Monti | |
| 8,555,720 B2 | 10/2013 | Schultz | |
| 8,764,458 B1 * | 7/2014 | Rathi | H04M 1/0274 |
| | | | 439/66 |
| 2004/0182165 A1 * | 9/2004 | Miyashita | G01L 9/0042 |
| | | | 73/718 |
| 2007/0087530 A1 * | 4/2007 | Yim | H01L 21/76871 |
| | | | 438/458 |
| 2011/0084378 A1 * | 4/2011 | Welch | H01L 21/56 |
| | | | 257/692 |
| 2013/0036815 A1 * | 2/2013 | Bernhardsgruetter | A47J 31/4457 |
| | | | 73/290 V |

OTHER PUBLICATIONS

Hamill, Dustin., "Thermal Effects on Alignment Stability of Electro Optical Systems", In Master Thesis Texas Tech University, Oct. 15, 2005, 94 pages.

* cited by examiner

ATHERMALIZED MOUNTING OF INERTIAL MEASUREMENT UNIT

BACKGROUND

An inertial measurement unit (IMU) is an electronic device that measures and reports a specific force, angular rate, and sometimes the magnetic field surrounding a device. This is accomplished by using a combination of integrated circuit (IC) components, such as one or more accelerometers, gyroscopes and/or magnetometers which are mounted on a printed circuit board (PCB). IMUs measure the angular velocity and linear acceleration experienced by the IC components as they are moved. This data is sent to computer processor(s) to calculate the corresponding movement and positioning of the IMU within a field of use.

Some IMUs are configured for use with augmented reality (AR) devices and virtual reality (VR) devices, measurement devices, GPS devices, personal monitors and so forth. For an IMU to work properly, it is important for the IC components to remain securely positioned within the IMU environment, so that any detected movement of the IMU is based on movement of the device that the IMU is mounted in, as a whole, rather than any displacement of the PCB or IC components relative to one or more other components within the IMU environment.

Conventional IMU systems typically mount the PCB containing the IC components to a mounting substrate composed of one or more plastic or metal materials. The PCB is fixed in place by pins, adhesives, brackets and/or other fasteners that prevent the PCB from moving within the IMU environment. However, even when the PCB is securely mounted in place, it is still be possible for the IC components to experience relative movement within the IMU environment because of thermal expansion.

Many PCBs are manufactured out of glass-reinforced epoxy laminates, such as FR-4 or other such materials, which have a coefficient of thermal expansion (CTE) that is different than the CTE of the plastics (e.g., Liquid Crystal Polymer (LCP) substrates) and/or metals that the PCB is mounted to. During use, and depending on the types of device components and heat sinks that the IMU is used with, the ambient temperature of the IMU environment can rise more than 5°-10° C. For instance, for a AR/VR device, LEDs are used for a display engine that might generate more than 2 watts (Joules per second), various SoC components might each generate 1-2 watts, a holographic processor might generate 1-2 watts, etc.

The resulting ambient heat that is generated within an IMU during use will cause the PCB to expand or shrink at a different rate than the substrate that the PCB is mounted to. This thermal expansion can cause bowing, warping, or other displacement of the PCB, which in turn can cause linear and/or angular displacement of the IC components contained on the PCB, relative to other IC and IMU components. This is problematic because the thermal displacement can invalidate the calibration of the sensitive components and thereby introduce inaccuracies when calculating movement and positioning of the IMU during use. This can be particularly detrimental for applied uses, such as the positioning of holograms within AR/VR devices, obtaining and using measurements with precision instruments (such as laser measurement devices), and so forth.

Accordingly, there is an ongoing need to identify improved structures and methods for mounting PCBs within IMUs.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed and claimed embodiments include printed circuit boards (PCBs) and inertial measurement units (IMU)s comprising athermalized mounting structures and corresponding methods of mounting the disclosed PCBs within one or more IMUs.

In some embodiments, the athermalized mounting structures are suitable for securing and positioning and the PCBs within an inertial measurement unit (IMU) in such a manner that the PCBs are enabled to experience thermal expansion within the IMU without causing bowing of the IC and/or significant displacement of the IC integrated circuit (IC) components, such as accelerometers and/or gyroscopes contained on the PCBs, relative to the IMU environment.

In some embodiments a PCB is configured with a PCB substrate having a top PCB substrate surface and an opposing bottom PCB substrate surface, as well as one or more sensors electrically and physically mounted to the substrate. The PCB also includes an athermalized mount comprising three mechanical mounting pins independently coupled to the PCB substrate and extending away from the PCB substrate to separate and corresponding pin ends that are configured in size and shape for physically engaging a mating/receiving surface of an object onto which the PCB is to be mounted, such as in a sliding engagement. The three mechanical mounting pins are angularly equidistant from one another, relative to a point encompassed by the pins.

In some embodiments, an IMU is configured with a PCB having an athermalized mount, wherein the PCB includes one or more movement sensors and three mechanical mounting pins independently coupled to the PCB. The mounting pins extend away from the PCB to separate and corresponding pin ends configured in size and shape for physically engaging the mating/receiving surface(s) of a mounting substrate onto which the PCB is to be mounted. In these embodiments, the mounting pins are also positioned angularly equidistant from one another relative to a location contained between the mounting pins. The IMU also includes three corresponding recesses formed into the mating surface of the mounting substrate of the IMU, the three recesses are configured in size and shape to physically receive and slidably engage the pin ends.

Some embodiments include methods for manufacturing an IMU with an athermalized mount. These methods include the securing of a PCB containing one or more movement sensors between a cover plate and mounting IUM substrate, wherein the PCB is configured with three mechanical mounting pins independently coupled to the printed circuit board and extending away from the printed circuit board to separate and corresponding pin ends configured in size and shape for physically engaging the mating/receiving surface(s) of a mounting IMU substrate onto which the PCB board is to be mounted. The three mechanical mounting pins are angularly equidistant from one another relative to a location positioned along a plane between the mounting pins.

The securing process also includes positioning the three separate corresponding pin ends into three corresponding grooved recesses formed into the mating surface of the mounting substrate and biasing the three mechanical mounting pins towards the mounting substrate with one or more biasing members that are positioned between the PCB and the cover plate and in such a manner that the three separate corresponding pin ends are enabled to slide, float or otherwise move within the grooved recesses during thermal expansion and thermal contraction of the printed circuit board.

In some embodiments, the mounting pins are enabled to move within the grooved recesses without causing linear and/or angular displacement of an IC component (which is substantially centrally positioned relative to the mounting pins), relative to one or more other IC components or IMU components.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

The disclosed embodiments include printed circuit boards (PCBs) and corresponding inertial measurement units (IMUs) that are configured with athermal mounting structures, as well as methods of assembly.

The athermal mounting structures of the PCBs are operable to position and contain the PCBs within the IMU in such a manner that the integrated circuit (IC) components (e.g., accelerometers and/or gyroscopes) of the PCB are not displaced within the IMU relative to the IMU environment and/or other components that are required to calculate overall position and/or movement of the IMU.

In some embodiments, the PCB is configured to experience thermal expansion at a different rate than other IMU components that the PCB is mounted to and thereby reduce bowing, warping and/or other distortions to the PCB, particularly distortions that would otherwise occur during use without the disclosed athermal mounting structures and configurations.

Figure 1A:
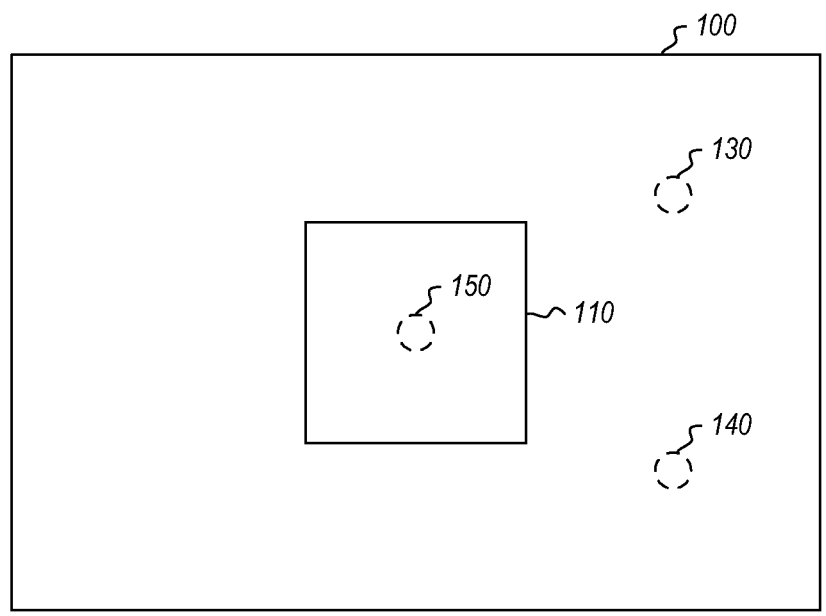
FIG. 1A illustrates an embodiment of a PBC having an IC sensor component.
Figure 1B:
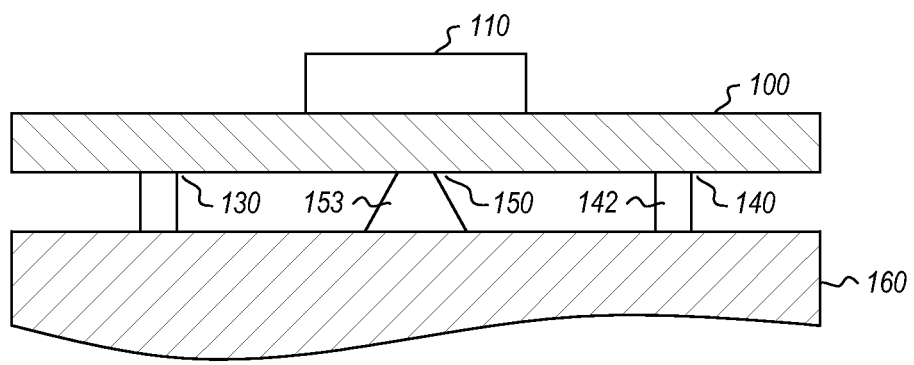
FIG. 1B illustrates an embodiment of the PCB shown in FIG. 1 and which is mounted to a IMU substrate with mounting pins and a pedestal mounting feature.

FIGS. 1A and 1B illustrate an embodiment of a PCB 100 having an IC sensor component 110. In this embodiment, the PCB 100 includes three mounting locations (130, 140 and 150), where the PCB 100 is fixedly attached to another structure, such as IMU mounting substrate 160. The first two mounting locations 130 and 140 correspond to mechanical pins (132 and 142) that fixedly attach the PCB 100 to the substrate 160. In some instances, this can be accomplished by gluing the pins to the PCB 100 and the substrate 160, as shown by pin 132. The pins can also pass substantially entirely through the PCB 100 and the substrate 160, as shown by pin 142, with or without the use of an adhesive.

In some embodiments, a structure such as pedestal 153 is used to further secure the PCB 100 in place. The pedestal 153 is formed out of a pressure sensitive adhesive (PSA) or another structure that is configured to absorb shock forces. This is beneficial to provide relative stability to the PCB 100 during use and to help prevent the PCB 100 from becoming dislodged during use.

In some embodiments, the ambient temperatures experienced within an IMU environment will cause the PCB 100 to expand or shrink at different rates than the substrate 160 or other structures the PCB 100 is mounted to. This can cause the PCB 100 to become dislodged from the adhesives applied to the pedestal 153 and/or the pin(s) due to shear forces experienced during the thermal expansion/contraction of the PCB 100. Once the PCB 100 is dislodged, the IMU position and movement calculations will be inaccurately calculated, based on the relative movement of the PCB components themselves (including movements and relative change in positioning within the IMU environment), rather than based on the movement and positioning of the IMU.

Even if the mounting locations 130, 140 and/or 150 do not fail/break during thermal expansion of the PCB 100, the PCB 100 may bow and/or warp in such a way as to cause angular displacement of the sensor 110. Even a miliradian offset to the sensor 110 in any axis of rotation, relative to the IMU structures that the PCB 100 is mounted to (e.g., substrate 160), can cause inaccuracies in the calculated positioning and/or movement of the IMU.

Various IMU and PCB embodiments incorporating athermal mounting structures will now be described, which can help to mitigate against one or more of the problems addressed above.

Figure 2:
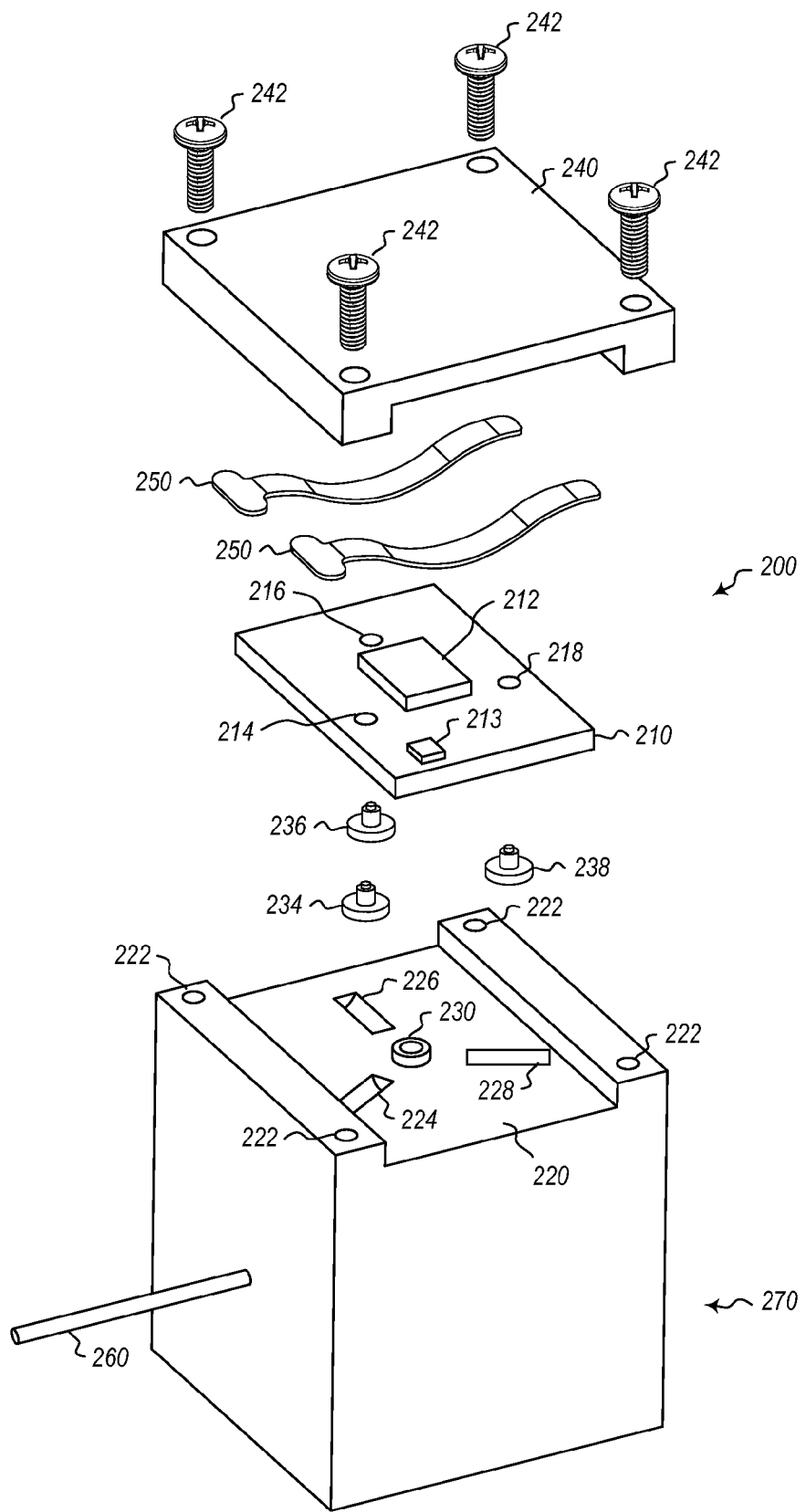
FIG. 2 illustrates an exploded component view of one embodiment of an IMU having a PCB with an IC sensor component and athermal mounting structures.

FIG. 2 illustrates an exploded view of one embodiment an IMU 200 which is configured with athermal mounting structures. As shown, the IMU 200 includes a PCB 210 that has a movement sensor 212. This movement sensor 212 includes one or more accelerometer(s) and/or one or more gyroscope(s). While shown as a single component, the sensor 212 can also be configured to include a plurality of separate sensors that are incorporated into a single IC and/or a plurality of separate ICs that are separately mounted to the PCB. Other PCB components are also contained on the PCB, as generally reflected in abstraction by component 213.

The PCB 210 includes holes (214, 216, 218) for receiving the stems of mechanical mounting pins (234, 236, 238), respectively. The holes (214, 216, 218) are angularly offset or equidistant from each other by 120°, as described in more detail below. While the holes (214, 216, 218) are implicitly shown as passing all the way through the PCB (inasmuch as they extend to the top surface of the PCB 210), in other embodiments, the holes are only partially formed into the opposing bottom surface of the PCB 210, similar to the hole configuration shown in FIG. 1B for pin 142.

Each of the mounting pins (234, 236, 238) is configured with a pin end which is configured in size and shape to be received within and to slidably engage corresponding grooves or slots (234, 236, 238) of the IMU mounting substrate 220. This will be described in more detail below with regard to FIGS. 5A-6B.

The axial orientations of the grooves (224, 226, 228) are also offset by 120° to correspond with the angular offset of the mounting pins (234, 236, 238) and PCB mounting holes (214, 216, 218). During thermal expansion of the PCB, the pins (234, 236, 238) are enabled to freely slide/float within the slotted grooves (224, 226, 228) as the PCB 210 contracts or expands relative to the mounting substrate 220, and without causing angular distortion to the sensor(s) 212 relative to the mounting structure substrate 220 and IMU environment.

In some instances, the aforementioned athermal structures (e.g., pins and grooves) are operable to reduce or eliminate the angular distortion (e.g., warping or bowing) and/or linear displacement that would otherwise occur to the PCB 210 relative to the IMU environment if the PCB 210 was fixedly mounted to the substrate 220 in the manner described above with regard to FIGS. 1A and 1B (given similar thermal conditions).

In some instances, a shock absorbing mount 230 is also provided, similar to the pedestal mount 153 of FIG. 1B. This shock absorbing mount 230 is composed of a PSA or a combination of one or more rigid structure(s) and a PSA between the rigid structure and the PCB 210. This shock absorbing mount 230 is operable to help stabilize the positioning of the sensor(s) 212 in a centralized location and to help absorb shock in such a way that the shock forces experienced by the IMU do not cause damage to the pins and grooves.

The IMU 200 also includes one or more biasing springs 250, which are configured to apply a biasing force against the PCB 210, causing the PCB to be biased towards the mounting substrate 220, once it is completely assembled. A mounting plate 240 is also provided to secure the biasing springs 250 in a placement between the mounting plate 240 and the PCB 210. The PCB 210 is ultimately secured between the mounting plate 240 and the IMU mounting substrate 220 when the screws 242 are threaded into receiving holes 222 of the IMU mounting substrate 220. This will be explained in more detail, below, with regard to FIGS. 6A and 6B With regard to the foregoing, it will be appreciated that the scope of this disclosure includes IMUs containing one or more combinations of the various components that are illustrated for IMU 200, as well as components that are not shown. For instance, the IMU 200 may include display engine components, imaging systems, laser systems, SoC systems, processors and/or other components that are integrated into and/or hidden from view. These hidden components are operable to receive and use the IMU position and movement information obtained from the PCB 210 sensor(s) 212 in order to perform a particular operation. In the present embodiment, a laser 260 is being generated and emitted from a housing 270 the IMU 200. However, the IMUs of this application are not limited to embodiments including lasers. They can include IMUs integrated into AR and VR devices, GPS devices, measurement devices, personal monitors and other devices.

Figure 3A:
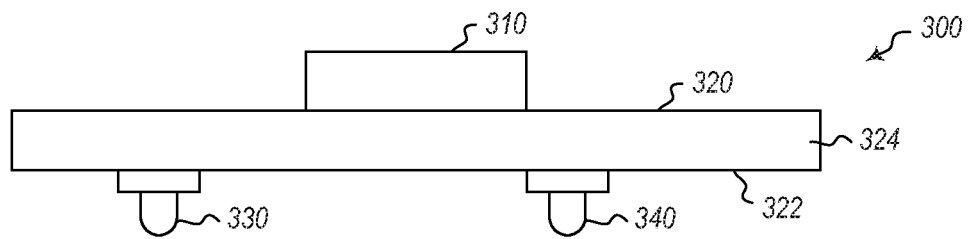
FIG. 3A-3C illustrate a side view, a bottom perspective view and a top view, respectively, of an embodiment a PCB having a IC sensor component and athermal mounting structures.
Figure 3B:
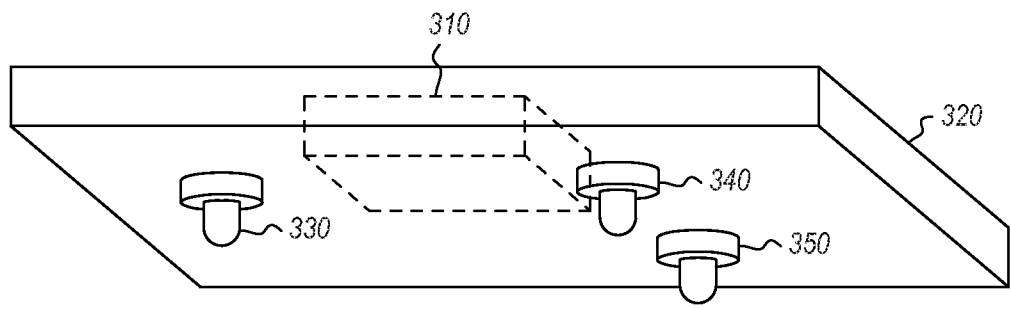
Figure 3C:
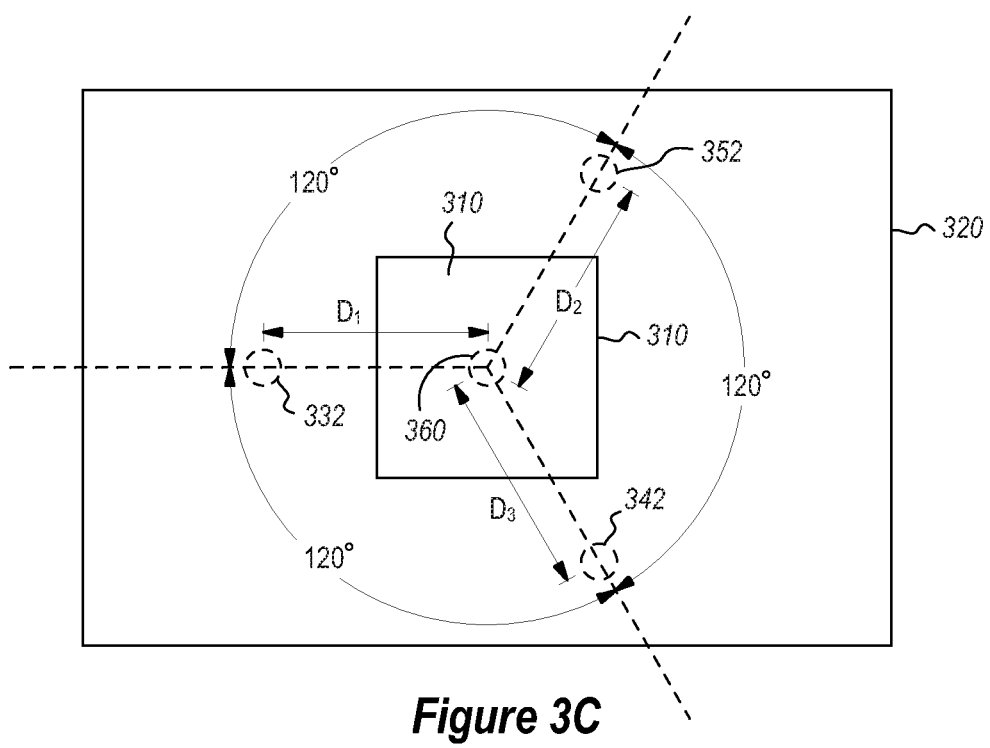

Attention will now be directed to FIGS. 3A-3C, which collectively illustrate a PCB 300 configured with athermal mounting structures. As shown, the PCB 300 includes a top surface 320 and a bottom surface 330 of the PCB substrate 324. An IC sensor 310 is currently mounted to the top surface 320. In other embodiments (not shown) the IC sensor 310 is mounted to the bottom surface.

The sensor 310 includes a combination of one or more accelerometer and one or more gyroscope. In some instances, the sensor 310 includes at least one accelerometer and at least one gyroscope. In some instances, the sensor 310 includes a plurality of separately mounted sensors that are mounted to the substrate 324.

The sensor 310 is also electrically coupled to other electronic sensors and components of the PCB 300 and IMU. However, electronic coupling for a PCB is not illustrated at this time, as it is well-understood to those of skill in the art.

The PCB 300 also includes three mechanical mounting pins 330, 340 and 350 that are each independently and physically coupled to the bottom surface 322 of the PCB 300. Each of these mechanical pins extend away from the PCB substrate to separate and corresponding pin ends that are configured in size and shape for physically engaging a receiving surface of an object (e.g., an IMU mounting substrate) onto which the PCB is to be mounted. In some embodiments, the three mechanical mounting pins are angularly equidistant from one another, being spaced apart 120° relative to each other and a centralized location encompassed by or otherwise bounded by the pin locations.

In some embodiments, the three mechanical mounting pins are also equidistant from the center point or central location 360 where the sensor 310 is located on the PCB 320, such that the distances (D1, D2 and D3) are substantially the same. However, this is not necessarily always the case, as reflected in FIG. 4.

Figure 4:
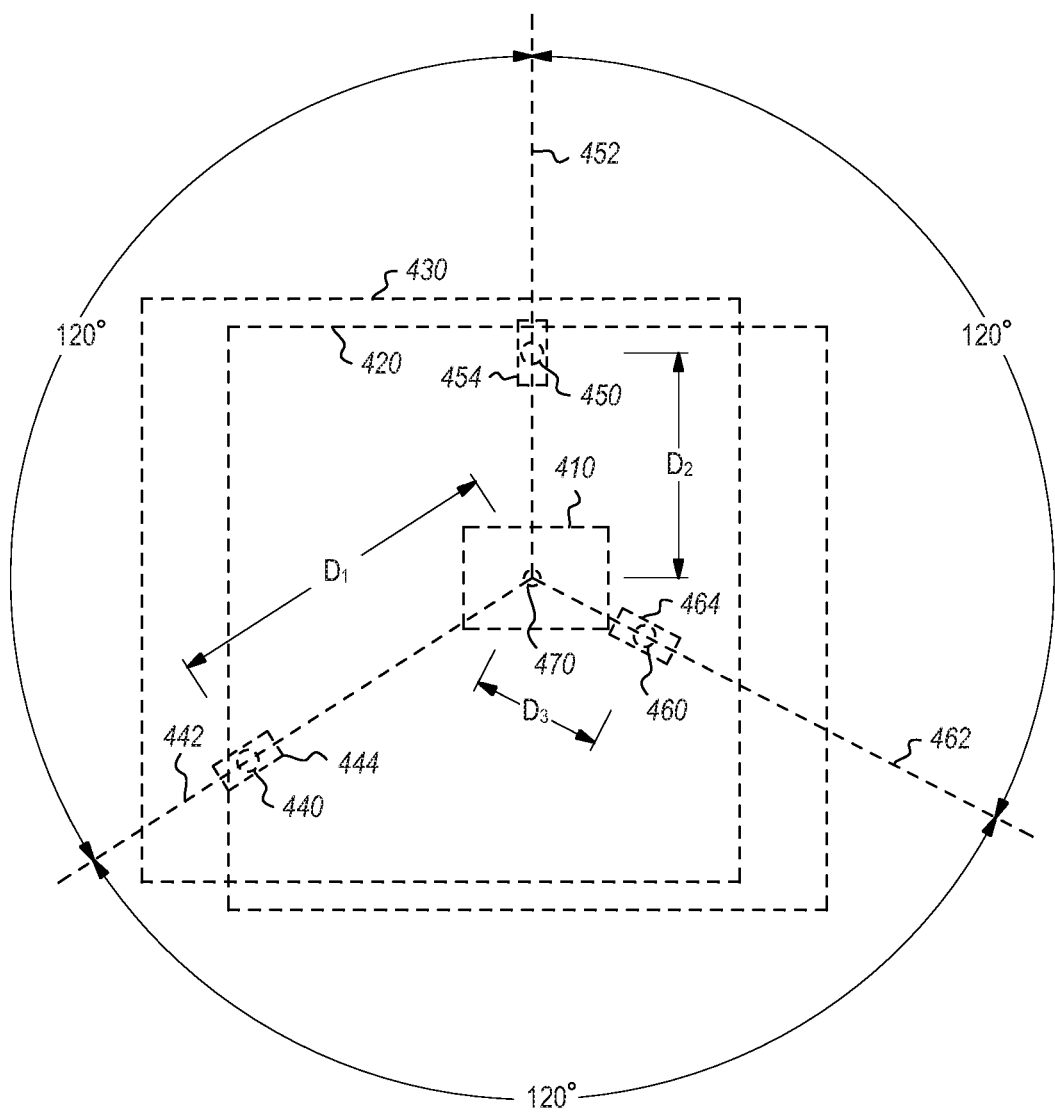
FIG. 4 illustrates embodiments of a top view layout for configuring placement of mounting structures relative to a PCB.

FIG. 4 shows, an embodiment in which the relative positioning (440, 450 and 460) or distances (D1, D2, D3) of the mechanical mounting pins from a central location 470 and the movement sensor (position 410) is not always required to be the same or equidistant. As shown, the mounting pin locations (440, 450, 460) are angularly equidistant from one another (being offset by 120°), even though they are not linearly equidistant from the central location 470. Accordingly, as long as the mounting pins are positioned along the 120° angular offset boundaries (452, 462, 472), respectively, they can be positioned at different distances from the central location 470.

The respective positioning (444, 454, 464) of the slotted grooves that are formed into the IMU mounting substrate and that configured to receive the mounting pins are also aligned with the 120° angular offset boundaries (452, 462 and 472). In this manner, each of the three recesses of the grooved slots has a longitudinal axis that intersects the center point 470 and that is co-axially aligned with one of the 120° angular offset boundaries (452, 462 and 472), respectively.

FIG. 4 also illustrates how the relative positioning of the PCB can also change relative to the PCB components, as long as the locations of the mechanical mounting pins remains angularly equidistant. For instance, the relative positioning of the movement sensor (410) and the mounting pins (440, 450, 460) remains the same in FIG. 4 for PCB position 420 and for PCB position 430.

In some embodiments, the one or more movement sensors on the PCB are positioned directly above at or at least substantially proximate a central point or location that exists and that is defined by the intersection between the 120° angular offsets between the mounting pin locations. In FIG. 4, this location is central location 470. In FIG. 3C, this location is location 360.

Figure 5A:
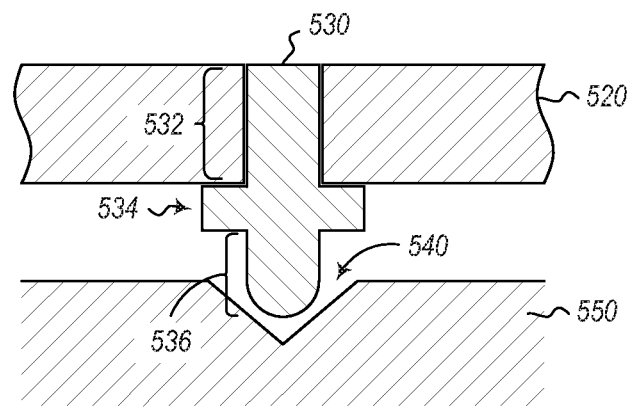
FIG. 5A illustrates one embodiment of a mounting pin structure and a corresponding recess that are operable for use in an athermal mounting of an IMU.
Figure 5B:
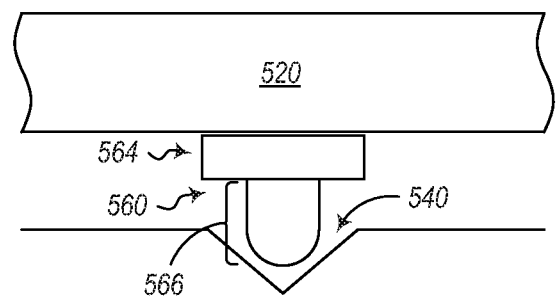
FIG. 5B illustrates another embodiment of a mounting pin structure and a corresponding recess that are operable for use in an athermal mounting of an IMU.
Figure 5C:
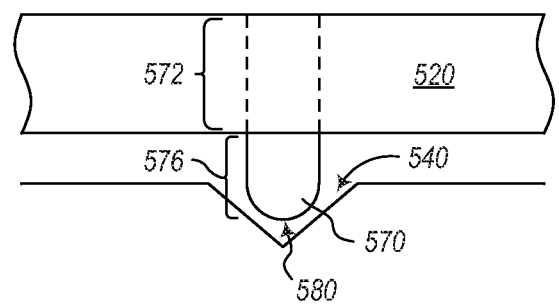
FIG. 5C illustrates another embodiment of a mounting pin structure and a corresponding recess that are operable for use in an athermal mounting of an IMU.

FIGS. 5A-5C will now be referenced to describe different configurations of the mechanical mounting pins. In FIG. 5A, a mechanical mounting pin 530 is shown to include a stem 532 that is configured in size and shape to be attached to and received within a corresponding hole formed in a PCB 520. The mechanical pin 530 also includes a shoulder 534 configured in size and shape to support the placement of the pin and to help prevent the pin from passing through the PCB 520 when force is applied to the pin end 536 towards the PCB 520.

The mechanical pin 530 is physically secured to the PCB 520 by an adhesive between the pin surface and the PCB substrate, a friction fit, a tapered fit, a snap fit, soldering and/or another means for attaching the mechanical pin 530 to the PCB 520.

In some embodiments the mechanical pin does not include a stem, such as implied by the illustration of the mechanical pin 560 shown in FIG. 5B. In this embodiment, the shoulder 564 is affixed directly to the substrate of the PCB 520, such as with an adhesive. In alternative embodiments, the mechanical pin 560 includes a reduced stem (not shown), but which is only partially inserted into a hole or recess of the PCB, similar to the configuration used for the pin 142 in FIG. 1B.

It is also possible for the mechanical pin to have a stem and no shoulder. For instance, the stem 572 of the mechanical pin 570, which is shown in FIG. 5C, has a suitable length (inserted completely or only partially) into a corresponding hole/recess in the PCB 520. However, there is no shoulder portion. Instead, the pin is solely affixed to the PCB 520 with a suitable means for attaching the pin to the PCB (e.g., adhesive, a friction fit, a tapered fit, a snap fit, soldering, and so forth).

Notably, each of the pin ends (536, 566, 576) preferably, although not necessarily, terminates in a free and hemispherical-shaped head, such as head 580. This can help enable the pin(s) to slidably engage the corresponding slotted groove(s) 540 formed into the IMU mounting substrate(s) 550. In this manner, the mechanical mounting pins are enabled to move (slide/float) within the grooved recesses without causing linear and/or angular displacement of an IC component (which is substantially centrally positioned relative to the mounting pins), relative to one or more other IC components or IMU components, as described above.

The hemispherical-shaped head 580 is not presently shown as being in direct contact with the sidewall surfaces of the slotted grooves (540). However, during actual use (subsequent to full assembly), the pin 570 of FIG. 5C and/or any of the other pins will be biased towards the IMU mounting substrate in such a manner that the pin end(s) will make actual contact with the surface(s) formed within the slotted grooves (540). Accordingly, the pin(s) will preferably be manufactured out of a material having a relatively low coefficient of friction with the surface(s) of the IMU mounting substrate 550. In some embodiments, the pin(s) or at least the pin ends (536,566 and 576) and/or the surfaces of the slotted grooves 540 are composed of or covered with a polycarbonate, Teflon, stainless steel, brass, or other such material.

The mechanical pins are operable with different sizes in diameter and length. In some instances, the diameter of the pin ends is between about 0.5 mm and 1.0 mm. However, the pin diameters can also be smaller than 0.5 mm or larger than 1.0 mm.

The slotted groove is presently shown to include an inner angle that is be greater than about 90°. However, in some embodiments, the inner angle is about 90°, or even less than 90°. The angle and depth of the slotted grooves is based on the size of the pin ends and the biasing forces applied by the biasing springs, so as to enable the pin ends to freely slide/float with the slotted grooves during thermal expansion of the PCB. In some alternative embodiments (not shown), the pin ends terminate in substantially flat surfaces and the slotted grooves comprise substantially rectilinear channels.

Figure 6A:
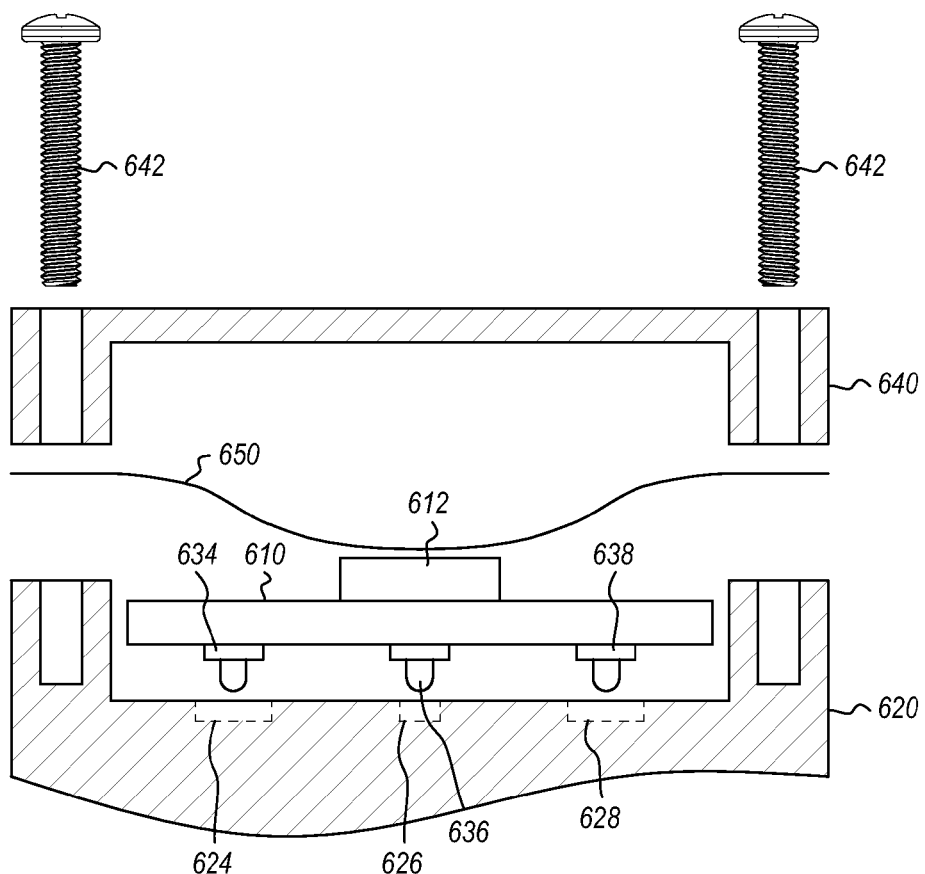
FIG. 6A illustrates an embodiment of IMU components that include athermal mounting structures before certain assembly processes.
Figure 6B:
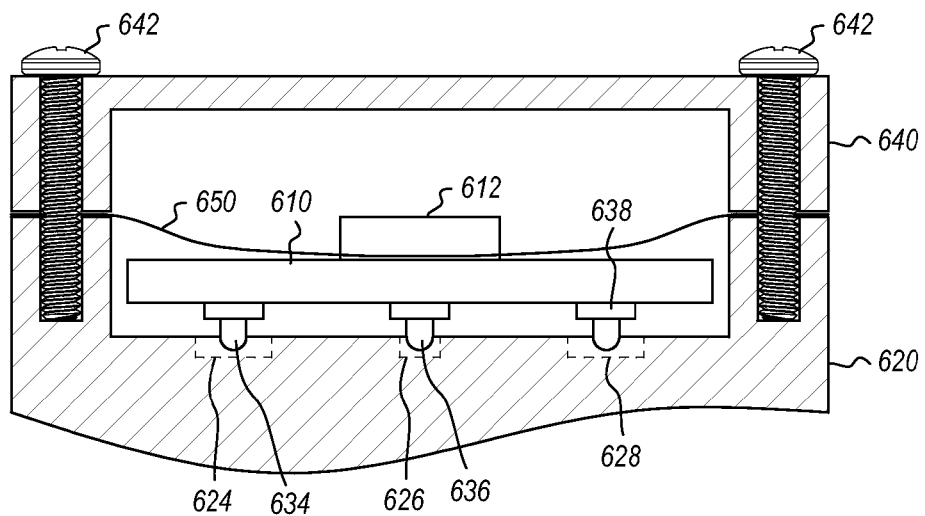
FIG. 6B illustrates the IMU components of FIG. 6B after certain assembly processes.

Attention will now be directed to FIGS. 6A-B, which illustrate an embodiment of an IMU with athermal mounting structures before and after completing certain assembly processes.

As shown, a PCB 610 is configured with a measurement sensor 612, as well as mounting pins (634, 636, 638) that are aligned with corresponding slotted grooves (624, 626, 628), respectively. FIGS. 6A and 6B also show biasing spring(s) 650. The biasing spring(s) 650 include one or more springs (such as the two springs 250 shown in FIG. 2) or more than two springs. Prior to affixing the cover plate 640 to the IMU mounting substrate 620, the biasing spring(s) will reside in a sprung/unstressed state (FIG. 6A). However, once the cover plate 640 is affixed to the IMU mounting substrate 620, the biasing spring(s) will have an unsprung/stressed state which is sufficient to bias the PCB 610 towards the IMU mounting substrate 620. This is illustrated by reduced curvature(s) associated with the spring(s) 650 in the assembled state of FIG. 6B relative to the unassembled state of FIG. 6A.

The spring force(s) applied by the biasing spring(s) 650 is sufficient to press and hold the PCB 610 against the mounting substrate 620 in such a manner as to securely maintain positioning of the mechanical mounting pins (634, 636, 638) correspondingly within the recesses of the slotted grooves (624, 626, 628), while still enabling the mechanical mounting pins (634, 636, 638) to slide/float within the recesses of the slotted grooves (624, 626, 628) during thermal expansion of the PCB 610.

While screws/bolts 642 are shown as one means for affixing the cover plate 640 to the IMU mounting substrate 620, it will be appreciated that various other mechanisms can also be used as a means for affixing the cover plate 640 to the IMU mounting substrate 620, including one or more latch(es), rivet(s), snap or friction fit(s) and so forth.

The biasing spring(s) 650 described above represent only one example of a biasing means that is suitable for biasing the PCB towards the IMU mounting substrate. These biasing spring(s) 650 can be replaced with or supplemented with any other biasing means that is capable of biasing the PCB towards the IMU mounting substrate, including any type of spring, spacers, or other structures. In one embodiment, the biasing means includes mechanical structures that protrude away from the cover 640, towards the PCB 610. An example of such protrusions are shown in FIGS. 7A and 7B.

Figure 7A:
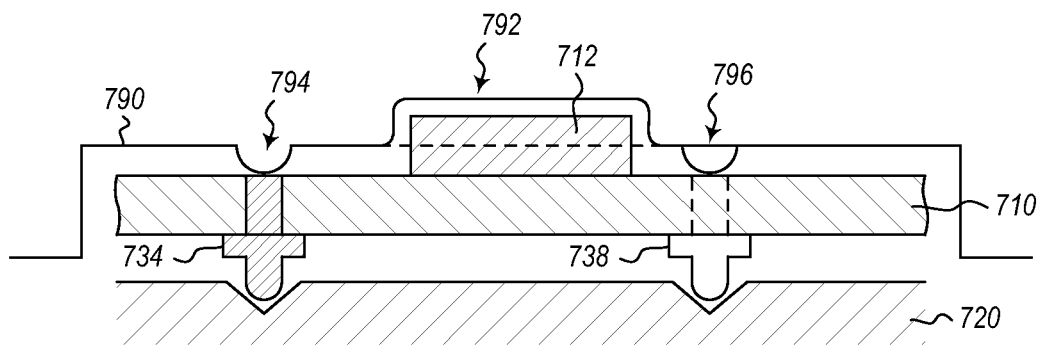
FIG. 7A illustrates a cutaway side view of a PCB configured with athermal mounting structures that include mounting pins and a shield for an IMU, wherein the shield includes dimpled areas configured to bias against the mounting pins during assembled use.
Figure 7B:
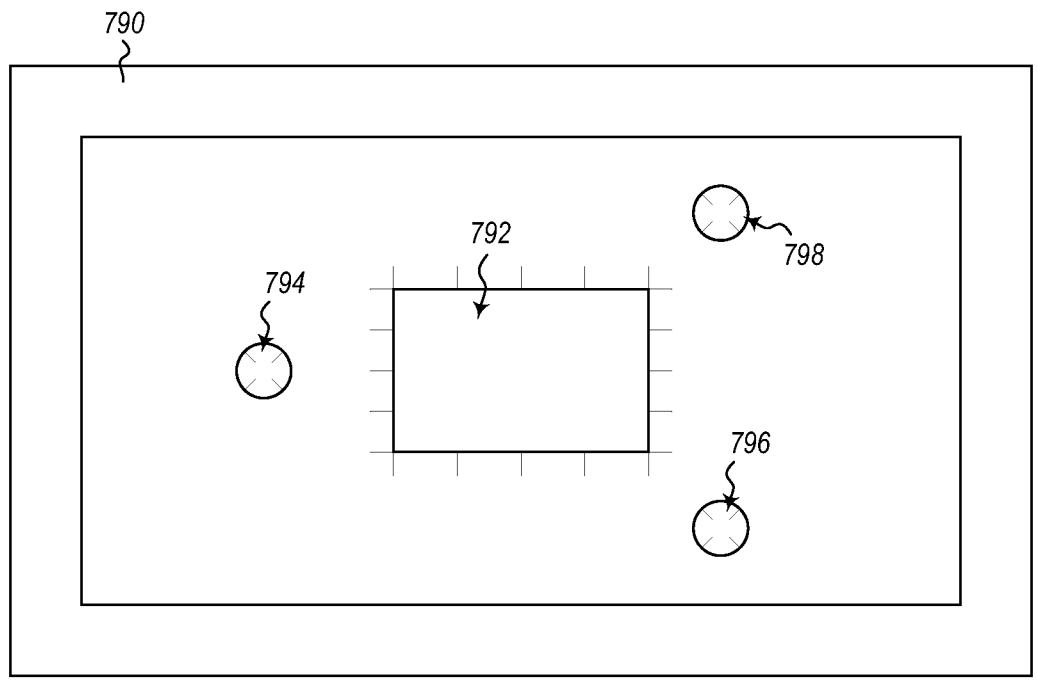
FIG. 7B illustrates a top view of the shield shown in FIG. 7A.

The view shown in FIG. 7A is a cutaway side view of the embodiment shown in FIG. 7B. As shown in these FIGS. 7A-7B), a set of dimpled protrusions (794, 796, 798) are formed in a cover 790 in such a manner that they extend inwardly toward the PCB 710. In this embodiment, the cover 790 might be an interference plate or magnetic shielding. Although, other cover(s) can also be used within the scope of the invention.

Currently, the dimpled and recessed protrusions (794, 796, 798) are aligned with the positioning of the mechanical pins. For instance, protrusion 794 is aligned with pin 734 and protrusion 796 is aligned with pin 739. The last protrusion 798 is also aligned with another pin (not shown). In this manner, the protrusions act as biasing members that are integrally formed into the cover (interference plate), which are sufficient to bias/hold the PCB 710 against the mounting substrate 720.

The cover 790 also includes a recessed portion or an outward protrusion 792 that is sufficient to receive/house the sensor(s) 712 when the cover 790 is positioned and affixed into the desired location relative to the IMU mounting substrate 720. Means for affixing the cover to the IMU mounting substrate 720 are not shown. However any of the means for affixing described above can also be used to affix the cover 790 to the IMU mounting substrate 720 (e.g., latch(es), rivet(s), snap or friction fit(s)), as well as any adhesive or other suitable attachment mechanism.

The foregoing embodiments describe PCBs and IMUs having athermalized mounting structures. The scope of this disclosure also extends to methods of use and manufacture of any of the disclosed PCBs and IMUs having athermalized mounting structures.

In some embodiments, methods are provided for securing a PCB containing one or more movement sensors between a cover plate and mounting substrate, wherein the PCB is configured with three mechanical mounting pins independently coupled to the printed circuit board and extending away from the printed circuit board to corresponding separate pin ends that are each configured in size and shape to physically/slidably engage a receiving surface of a mounting substrate onto which the PCB board is to be mounted. The three mechanical mounting pins are angularly equidistant from one another relative to a location positioned along a plane between the mounting pins.

The securing also includes positioning the three separate corresponding pin ends into three corresponding grooved recesses formed into the mating surface of the mounting substrate and which are also angularly equidistant from one another. The securing includes using one or more biasing members that are positioned between the PCB and the cover plate to flexibly bias the three mechanical mounting pins towards the mounting substrate and in such a manner that the three separate corresponding pin ends are enabled to slide within the grooved recesses during thermal expansion and thermal contraction of the printed circuit board.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A printed circuit board configured with an athermalized mounting structure, comprising:
   a substrate having a top substrate surface and an opposing bottom substrate surface;
   at least one of an accelerometer or a gyroscope electrically and physically mounted to the substrate; and
   three mechanical mounting pins independently coupled to the substrate and extending away from the substrate to separate and corresponding pin ends configured in size and shape for physically engaging a mating surface of an object onto which the printed circuit board is to be mounted, and the three mechanical mounting pins being angularly equidistant from one another such that the three mechanical mounting pins are spaced apart 120 degrees relative to each other and a centralized location encompassed by the mechanical mounting pins.

2. The printed circuit board of claim 1, wherein the three mechanical mounting pins are further equidistant from the center point.

3. The printed circuit board of claim 1, comprising the accelerometer.

4. The printed circuit board of claim 1, comprising the gyroscope.

5. The printed circuit board of claim 1, comprising both of the accelerometer and the gyroscope, wherein the gyroscope and accelerometer are each separately mounted to the substrate.

6. The printed circuit board of claim 1, wherein each of the mechanical mounting pins extends away from the bottom substrate surface to the corresponding pin ends, and the one or more sensors are mounted to the top substrate surface.

7. The printed circuit board of claim 1, wherein the coupling of the mechanical mounting pins to the substrate includes an adhesive coupling.

8. The printed circuit board of claim 1, wherein the mechanical mounting pins are physically interconnected with the substrate by having a mounting portion of each of the three mechanical mounting pins being physically inserted into a corresponding separate recess or aperture formed into at least the bottom substrate surface.

9. The printed circuit board of claim 1, wherein each of the pin ends terminates in a hemispherical-shaped head.

10. An inertial movement unit with an athermalized mounting structure, comprising:
    a printed circuit board with one or more movement sensors; and
    three mechanical mounting pins independently coupled to the printed circuit board and extending away from the printed circuit board to separate and corresponding pin ends configured in size and shape for physically engaging a mating surface of a mounting substrate onto which the printed circuit board is to be mounted, and the three mechanical mounting pins being angularly equidistant from one another such that the three mechanical mounting pins are spaced apart 120 degrees relative to each other and a centralized location encompassed by the mechanical mounting pins; and three recesses formed into the mating surface of the mounting substrate, the three recesses being configured in size and shape to physically receive the pin ends.

11. The inertial movement unit of claim 10, wherein the inertial movement unit further includes at least a cover plate and one or more biasing members disposed between the cover plate and the printed circuit board, the one or more biasing members applying a force to the printed circuit board that securely biases the printed circuit board towards the mounting substrate and to thereby securely maintain a position of the mechanical mounting pins correspondingly within the three recesses.

12. The inertial movement unit of claim 11, wherein the cover plate is secured to the mounting substrate with a plurality of screws.

13. The inertial movement unit of claim 11, wherein the one or more biasing members is integrally formed into an interference plate.

14. The inertial movement unit of claim 11, wherein the one or more biasing members includes a plurality of separate springs.

15. The inertial movement unit of claim 10, wherein the three recesses form grooved slots, each of the grooved slots having a longitudinally axis that axially aligns with and intersects the center point.

16. The inertial movement unit of claim 15, wherein the mounting pins terminate in separate free ends that are slidably and correspondingly received within the grooved slots.

17. The inertial movement unit of claim 16, wherein each of the separate free ends comprises a hemispherical head.

18. The inertial movement unit of claim 10, wherein the inertial movement unit further includes a shock buffer member disposed between the printed circuit board and the mounting substrate.

19. The inertial movement unit of claim 16, wherein the shock buffer member comprises an adhesive.

20. A method for manufacturing an inertial movement unit with an athermalized mounting structure, comprising:

securing a printed circuit board with one or more movement sensors between a cover plate and mounting substrate, wherein the printed circuit board is configured with three mechanical mounting pins independently coupled to the printed circuit board and extending away from the printed circuit board to separate and corresponding pin ends configured in size and shape for physically engaging a mating surface of a mounting substrate onto which the printed circuit board is to be mounted, and the three mechanical mounting pins being angularly equidistant from one another, such that the three mechanical mounting pins are spaced apart 120 degrees relative to each other and a centralized location encompassed by the mechanical mounting pins, and wherein said securing further includes positioning the three separate corresponding pin ends into three corresponding grooved recesses formed into the mating surface of the mounting substrate and biasing the three mechanical mounting pins towards the mounting substrate with one or more biasing members that are positioned between the printed circuit board and the cover plate and in such a manner that the three separate corresponding pin ends are enabled to slide within the grooved recesses during thermal expansion and thermal contraction of the printed circuit board.

* * * * *